US008542546B2

(12) United States Patent
Matsui et al.

(10) Patent No.: US 8,542,546 B2
(45) Date of Patent: Sep. 24, 2013

(54) SEMICONDUCTOR MEMORY DEVICE AND METHOD FOR TESTING SAME

(75) Inventors: Yoshinori Matsui, Chuo-ku (JP); Shoji Kaneko, Chuo-ku (JP)

(73) Assignee: Elpida Memory, Inc., Tokyo (JP)

( * ) Notice: Subject to any disclaimer, the term of this patent is extended or adjusted under 35 U.S.C. 154(b) by 278 days.

(21) Appl. No.: 12/512,573

(22) Filed: Jul. 30, 2009

(65) Prior Publication Data

US 2010/0027354 A1 Feb. 4, 2010

(30) Foreign Application Priority Data

Aug. 1, 2008 (JP) ................................ 2008-199843

(51) Int. Cl.
*G11C 7/00* (2006.01)
*G11C 7/10* (2006.01)
(52) U.S. Cl.
USPC ..................................... 365/201; 365/189.05
(58) Field of Classification Search
USPC .................... 365/189.05, 193, 230.08, 233.1, 365/201
See application file for complete search history.

(56) References Cited

U.S. PATENT DOCUMENTS

| 5,426,737 | A | * | 6/1995 | Jacobs ............................ 710/27 |
| 5,829,026 | A | * | 10/1998 | Leung et al. ................... 711/122 |
| 6,172,927 | B1 | * | 1/2001 | Taylor ........................... 365/219 |
| 6,324,118 | B1 | | 11/2001 | Ooishi | |
| 2003/0141922 | A1 | * | 7/2003 | Keeth et al. .................... 327/536 |
| 2005/0134340 | A1 | * | 6/2005 | Lee ................................. 327/172 |
| 2007/0247933 | A1 | * | 10/2007 | Kagan ........................... 365/193 |
| 2008/0025116 | A1 | * | 1/2008 | Choi et al. ..................... 365/193 |

FOREIGN PATENT DOCUMENTS

JP 2000-076853 A 3/2000

* cited by examiner

*Primary Examiner* — Alexander Sofocleous
*Assistant Examiner* — Khamdan Alrobaie
(74) *Attorney, Agent, or Firm* — Sughrue Mion, PLLC

(57) ABSTRACT

A semiconductor memory device includes data input/output terminals (DQ0 to DQ31), a memory cell array 122, and a data latch circuit 111 for temporarily latching data captured from the data input/output terminals and writing the data in the memory cell array with a delay in a normal write operation. The device also includes a test mode in which the data latch circuit latches data read to the data input/output terminals in a read operation and writes previously latched data in the memory cell array without newly latching data from the data input/output terminals in a write operation.

18 Claims, 11 Drawing Sheets

US 8,542,546 B2

SEMICONDUCTOR MEMORY DEVICE AND METHOD FOR TESTING SAME

REFERENCE TO RELATED APPLICATION

This application is based upon and claims the benefit of the priority of Japanese patent application No. 2008-199843, filed on Aug. 1, 2008, the disclosure of which is incorporated herein in its entirety by reference thereto.

FIELD OF THE INVENTION

The present invention relates to a semiconductor memory device and a method for testing same.

BACKGROUND

In recent years, in response to demands from the market for smaller mobile devices, a system in which DRAMs and processor chips are stacked in the same package is being developed. In such system, since signal terminals that transmit data between the DRAMs and the processors are connected by wirings inside the package, it is difficult to inspect the DRAM chips directly through external terminals after sealed in the package. For this reason, such DRAMs need to be inspected for quality inspection before mounted on a package, that is, at the wafer level. In order to reduce costs for testing, the DRAM wafer inspection is carried out on 200 chips or more by simultaneously probing signal terminals from a memory tester. Thus, the number of signals assigned to each of the memory chips is limited by the total number of signal terminals of the memory tester. Meanwhile, in the system configuration of such mobile device, for better performance, the data input/output terminals of the DRAM is being extended to ×16, ×32, and ×64 to increase the data transmission rate. Thus, conventionally, DRAMs used for such purposes have a test mode, aiming to realize a wafer inspection with a small number of signal terminals and a certain number of data input/output terminals even when measuring many chips simultaneously.

Patent Document 1 discloses a double-data-rate synchronous dynamic random access memory (hereinafter referred to as DDR-SDRAM) that conducts a test with 8 input/output terminals (DQ0, DQ4, DQ8, DQ12, DQ16, DQ20, DQ24, and DQ28) among 32 data input/output terminals (DQ0 to DQ31) (see FIGS. 21 to 23, FIGS. 27 and 28, and paragraphs 0005 to 0009, 0172 to 0189, and 0207 to 0221 of Patent Document 1; or FIGS. 21 to 23, FIGS. 27 and 28, and column 1 line 40 to column 2 line 8, column 19 line 46 to column 21 line 5, and column 22 line 62 to column 24 line 7 of U.S. Pat. No. 6,324,118).

Patent Document 1: Japanese Patent Kokai Publication No. JP-P2000-76853A, which corresponds to U.S. Pat. No. 6,324,118

SUMMARY

The entire disclosure of Patent Document is incorporated herein by reference thereto.

The following is an analysis by the present invention.

With the test mode as disclosed in the above Patent Document 1, even in the case of a DRAM chip having many data input/output terminals (DQ terminals), it is possible to inspect the memory cell array by probing only a small number of the data input/output terminals. However, according to studies made by the present inventors, with this test method, a normal operation in which reading from/writing to a DRAM is conducted via all the DQ terminals described above cannot be tested. Especially, in recent years, the operating frequency of a DRAM is being increased, which is also the case with those DRAMs stacked with processor chips in the same package as described in the above system. In such cases, high-speed operation of input/output circuits in a normal operation needs to be checked when inspecting the wafer.

A semiconductor memory device according to a first aspect of the present invention comprises: a data input/output terminal; a memory cell array; and a data latch circuit configured to temporarily latch data captured from the data input/output terminal and write the data in the memory cell array with a delay in a normal write operation. Further, the semiconductor memory device has a test mode in which the data latch circuit latches data read to the data input/output terminal in a read operation and writes previously latched data in the memory cell array without newly latching data from the data input/output terminal in a write operation.

In addition, a semiconductor memory device according to a second aspect of the present invention is a synchronous semiconductor memory device comprising: a data input/output terminal; a memory cell array; and a data latch circuit configured to temporarily latch data captured from the data input/output terminal in synchronization with a data strobe signal supplied from the outside and write the data in the memory cell array with a delay when a normal write command is executed. The synchronous semiconductor memory device further comprises an internal data strobe signal generation circuit and has a test mode in which the data latch circuit latches data read to the data input/output terminal in synchronization with an internal data strobe signal generated by the internal data strobe signal generation circuit when a read command is executed and writes previously latched data in the memory cell array without newly latching data from the data input/output terminal when a write command is executed.

A semiconductor memory device according to a third aspect of the present invention comprises: a data input/output terminal; a memory cell array; and a data latch circuit configured to temporarily latch data captured from the data input/output terminal and write the data in memory cell array later. The semiconductor memory device has: a first command for latching data captured from the data input/output terminal in the data latch circuit in synchronization with a strobe signal supplied from the outside and writing the latched data in the memory cell array in synchronization with an internal clock; a second command for reading data from the memory cell array to the data input/output terminal and latching the read data in the data latch circuit; and a third command for writing data stored in the data latch circuit in the memory cell array without newly capturing data from the data input/output terminal into the data latch circuit.

A semiconductor memory device test method according to a fourth aspect of the present invention is a method for testing a semiconductor memory device comprising: a plurality of data input/output terminals; and a memory cell array in which one address is composed of multiple bits that can be read/written in parallel with the use of the plurality of data input/output terminals and having a test mode in which data read in parallel from the multiple-bit memory cell array to the plurality of data input/output terminals is written in parallel in a multiple-bit address different from the read address. The test is conducted by writing first and second data in first and second regions, respectively, in the memory cell array in advance, using the test mode, writing the second data read from the second region in the first region, and reading the data from the first region after the second data is written in the first region.

The meritorious effects of the present invention are summarized as follows.

According to the present invention, a read/write test, including input/output circuits between the memory cell array and the data input/output terminals, can be conducted efficiently.

Other features and advantages of the present invention will be apparent from the following description taken in conjunction with the accompanying drawings, in which like reference characters designate the same or similar parts throughout the figures thereof.

PREFERRED MODES OF THE INVENTION

Exemplary embodiments of the present invention will be hereinafter described with reference to the attached drawings as needed.

Figure 1:
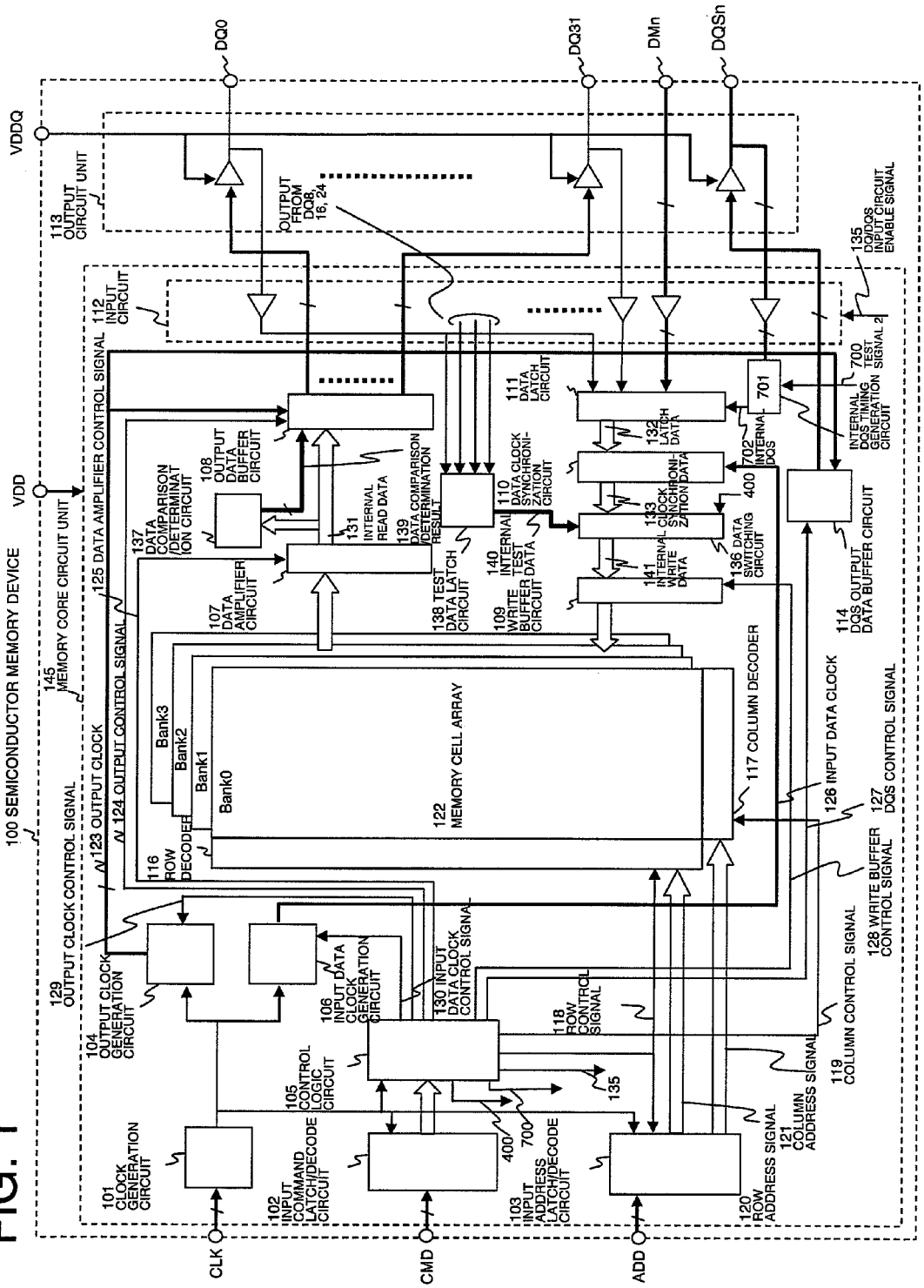
FIG. 1 shows an overall block diagram of a semiconductor memory device according to one example of the present invention.
Figure 9:
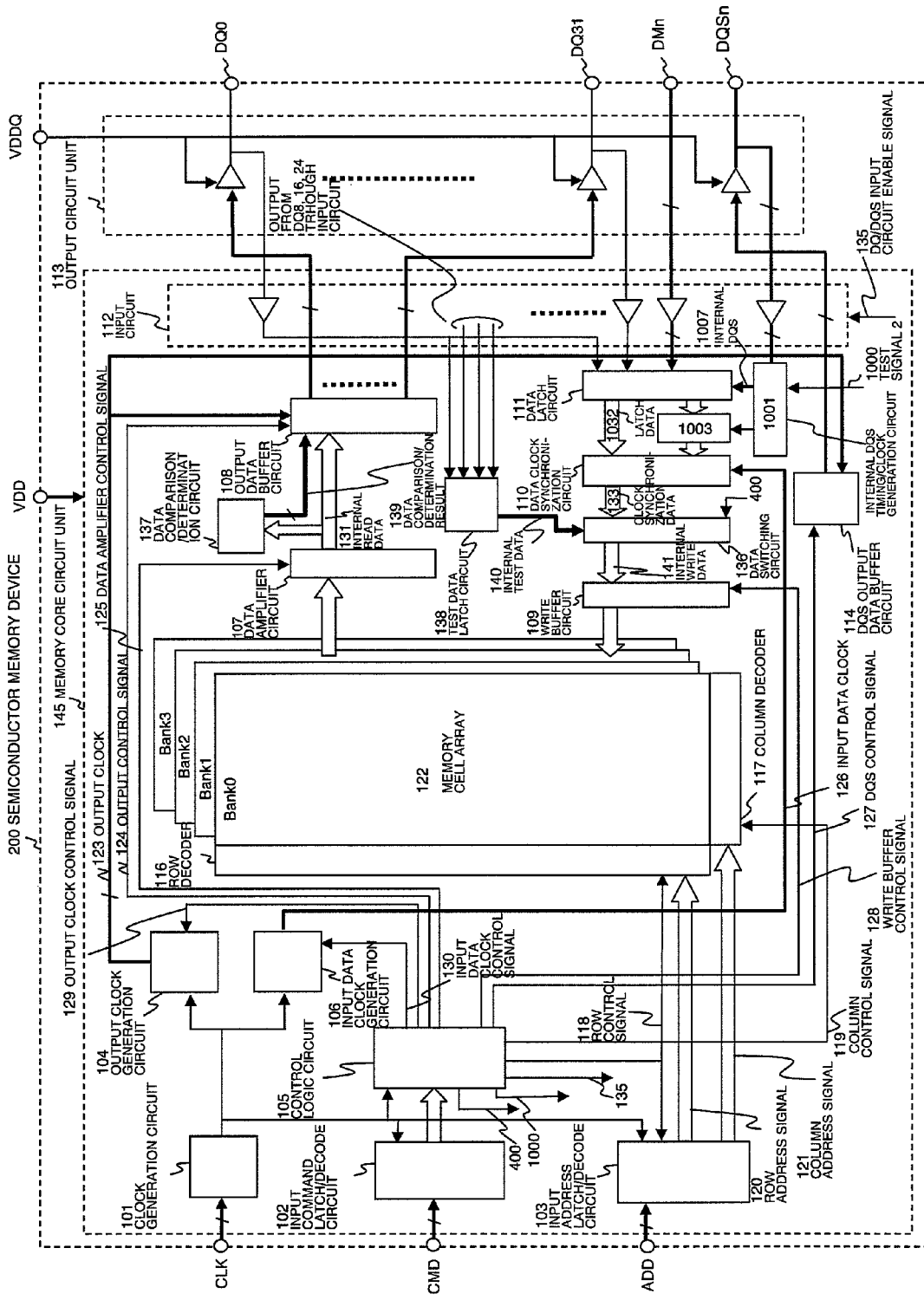
FIG. 9 shows an overall block diagram of a semiconductor memory device according to another example of the present invention.

As shown in FIGS. 1 and 9, a semiconductor memory device (100, 200) according to one exemplary embodiment of the present invention comprises: data input/output terminals (DQ0 to DQ31); a memory cell array 122; and a data latch circuit 111 (see FIGS. 2 and 10 for details) for temporarily latching data captured from the data input/output terminals (DQ0 to DQ31) and writing the data in the memory cell array 122 with a delay in a normal write operation. The semiconductor memory device has a test mode (see FIG. 7 for the timing of an internal DQS signal) in which the data latch circuit 111 latches data read to the data input/output terminals (DQ0 to DQ31) in a read operation and writes previously latched data in the memory cell array 122 without newly latching data from the data input/output terminals (DQ0 to DQ31) in a write operation.

Namely, in the test mode, the data read from the memory cell array 122 to the input/output terminals (DQ0 to DQ31) is latched in the data latch circuit 111 and the latched data in the data latch circuit is written in the memory cell array again. Thus, by writing initial values in the memory cell array 122 in advance by a certain method, a data read test from the memory cell array to the input/output terminals and a data write test from the input/output terminals to the memory cell array can be conducted without probing all the input/output terminals.

As shown in FIGS. 1 and 9, the semiconductor memory device (100, 200) according to one exemplary embodiment of the present invention may comprise an input circuit 112 for sending data from the data input/output terminals (DQ0 to DQ31) to the data latch circuit 111. The input circuit 112 may be configured to turn on in a normal write operation, turn off in a normal read operation (see FIG. 3 for RED and WRT commands and the timing of a DQ/DQS input circuit enable signal). In the test mode, the input circuit 112 may be configured to turn on in a read operation and turn off in a write operation (see the timing chart in FIG. 7).

In accordance with the above structure, even when all the data input/output terminals are not probed, input circuits relating to input/output terminals that are not probed can also be tested.

Figure 7:
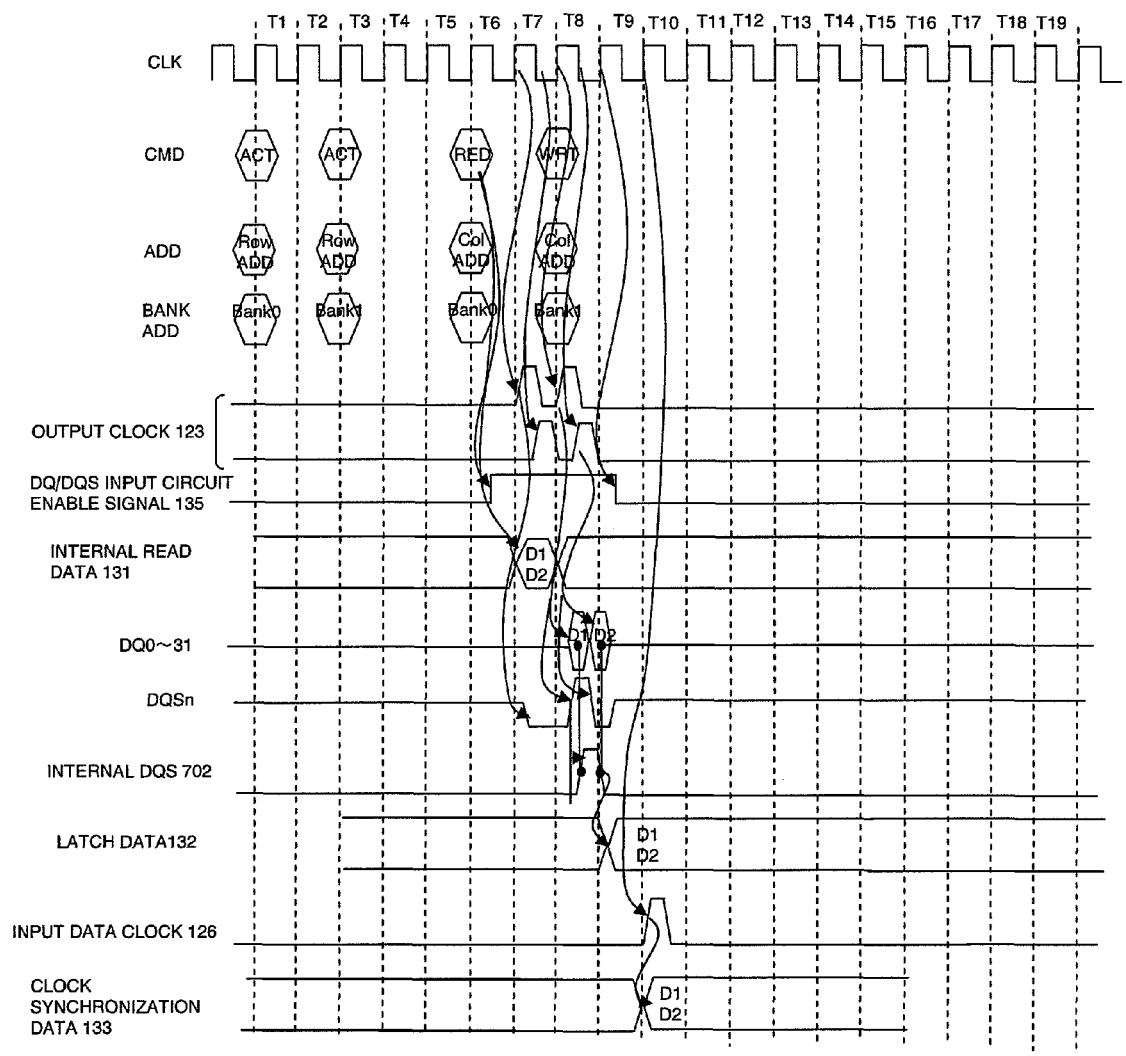
FIG. 7 shows a timing chart of a read/write operation in a first test mode of the semiconductor memory device according to one example of the present invention (in a normal read/write test mode).

Also, as shown in FIGS. 1 and 9, according to the semiconductor memory device of one exemplary embodiment of the present invention, the semiconductor memory device (100, 200) may further comprise an internal data strobe signal generation circuit (701, 1001) and be structured so that data captured from the data input/output terminals (DQ0 to DQ31) is latched in the data latch circuit 111 in synchronization with a data strobe signal DQSn supplied from the outside in a normal write operation (see FIG. 3 for the timing of the DQ and DQS signals in a write operation) and that, in a read operation in the test mode, data read to the data input/output terminals (DQ0 to DQ31) is latched in synchronization with an internal data strobe signal (702, 1007) generated by the internal data strobe signal generation circuit (701, 1001) (see FIG. 7 for timing of the DQ and internal DQS signals in a write operation).

In accordance with the above structure, since the internal data strobe signal generation circuit is provided, data read from the memory cell array 122 can be latched in the data latch circuit 111 without supplying any data strobe signal from the outside in a read operation.

In addition, as shown in FIG. 9, the semiconductor memory device according to one exemplary embodiment of the present invention may further comprise, in the test mode, a FIFO circuit 1003 for temporarily capturing data read by a burst operation from the memory cell array 122 to the input/output terminals (DQ0 to DQ31) and a clock generation circuit 1001 for generating a clock 1008 for capturing data into the FIFO circuit 1003 and sending the data captured into the FIFO circuit 1003 toward the memory cell array.

In accordance with the above structure, since data read by a burst operation from the memory cell array 122 to the input/output terminals (DQ0 to DQ31) is temporarily captured by the FIFO circuit 1003, the data read by the burst operation can be written in the memory cell array 122 again.

Furthermore, as shown in FIGS. 1 and 9, the semiconductor memory device according to one exemplary embodiment of the present invention may be a synchronous semiconductor memory device comprising: data input/output terminals (DQ0 to DQ31); a memory cell array 122; and a data latch circuit 111 for temporarily latching data captured from the data input/output terminals in synchronization with a data strobe signal DQSn supplied from the outside and writing the data in the memory cell array with a delay when a normal write command is executed. The synchronous semiconductor memory device may further comprise an internal data strobe signal generation circuit (701, 1001) and a test mode in which the data latch circuit 111 latches data read to the data input/output terminals (DQ0 to DQ31) in synchronization with an internal a data strobe signal (702, 1007) generated by the internal data strobe signal generation circuit (701, 1001) when a read command is executed and writes the previously latched data in the memory cell array 122 without newly latching data from the data input/output terminals (DQ0 to DQ31) when a write command is executed (see the timing chart of FIG. 7).

In a synchronous semiconductor memory device such as a DDR-SDRAM that performs pipeline operation in synchronization with a clock supplied from the outside, since a strobe signal (DQS signal) for capturing data from the data input/output terminals (DQ0 to DQ31) is not supplied from the outside when a read command is executed, the internal data strobe signal generation circuit (701, 1001) may be provided.

Further, as shown in FIGS. 1 and 9, the semiconductor memory device according to one exemplary embodiment of the present invention comprises: data input/output terminals (DQ0 to DQ31); a memory cell array 122; and a data latch circuit 111 for temporarily latching data captured from the data input/output terminals and writing the data in the memory cell array later. The semiconductor memory device has: a first command for latching data captured from the data input/output terminals (DQ0 to DQ31) in the data latch circuit 111 in synchronization with a strobe signal DQSn supplied from the outside and writing the latched data in the memory cell array in synchronization with an internal clock (see the timing chart of FIG. 3 for the normal write command (WRT)); a second command for reading data from the memory cell array 122 to the data input/output terminals (DQ0 to DQ31) and latching the read data in the data latch circuit 111 (see the timing chart of FIG. 7 for the a read command (RED) in a first test mode); and a third command for writing data stored in the data latch circuit 111 in the memory cell array 122 without newly capturing data from the data input/output terminals (DQ0 to DQ31) into the data latch circuit 111 (see the timing chart of FIG. 7 for a write command (WRT) in the first test mode).

By providing the above first to third commands, in addition to a normal write operation, a read/write test using input/output circuits of data input/output terminals can be executed.

Figure 8:
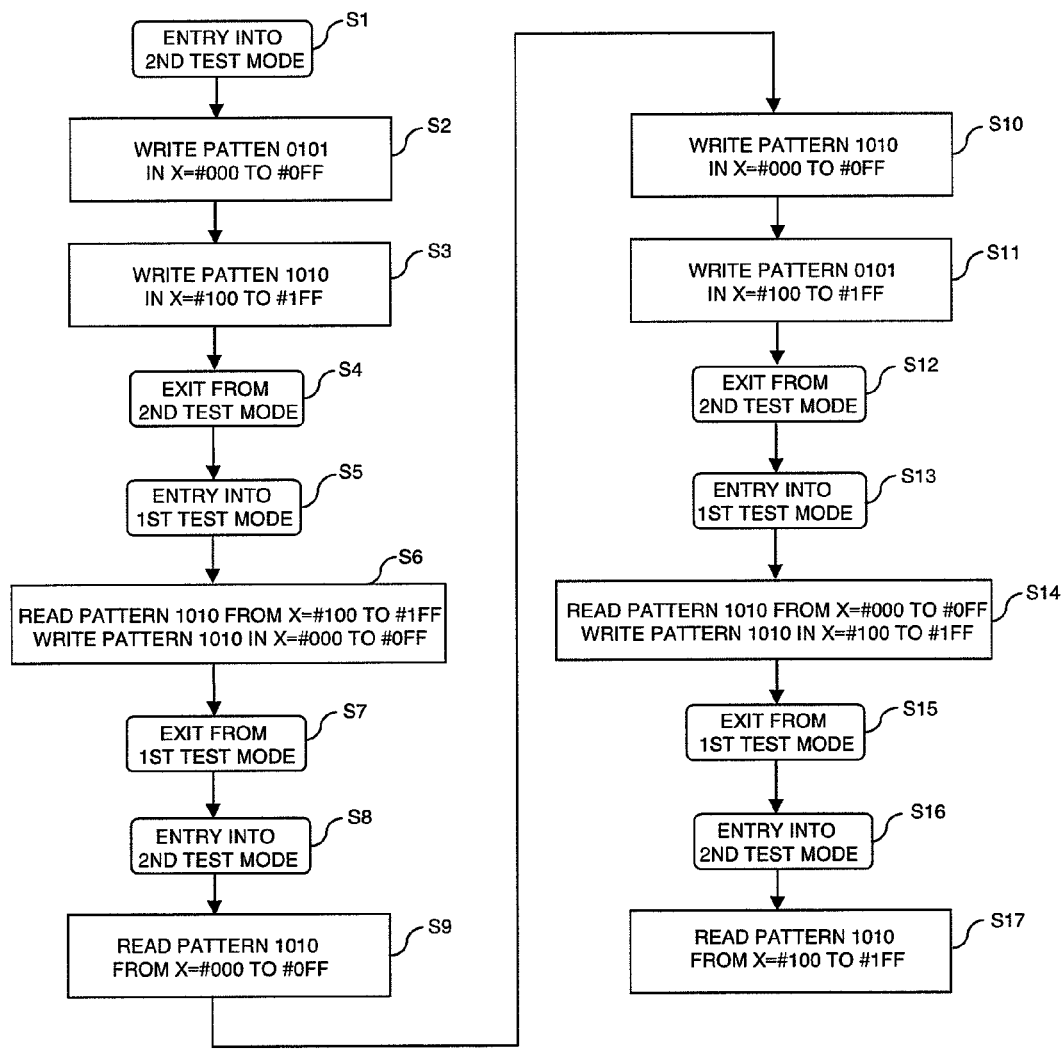
FIG. 8 shows a flow chart of a method for testing the semiconductor memory device according to one example of the present invention.

Also, as shown in FIGS. 1, 8, and 9, a semiconductor memory device test method according to one exemplary embodiment of the present invention is a method for testing the semiconductor memory device (100, 200) comprising: a plurality of data input/output terminals (DQ0 to DQ31 in FIGS. 1 and 9); and a memory cell array (reference numeral 122 in FIGS. 1 and 9) in which one address is composed of multiple bits that can be read/written in parallel with the use of the plurality of data input/output terminals (DQ0 to DQ31). The device has a test mode in which data read in parallel from the multiple-bit memory cell array 122 to the plurality of data input/output terminals (DQ0 to DQ31) is written in parallel in a multiple-bit address different from the read address.

According to the test method, first and second data is written in first and second regions, respectively, in the memory cell array in advance (steps S2 and S3 in FIG. 8), and using the test mode, the second data read from the second region is written in the first region (step S6) and the data is read from the first region after the second data is written in the first region (step S9).

In accordance with the above test method, since certain regions in the memory cell array are provided with initial values in advance, by reading the initial values in parallel from the memory cell array to the data input/output terminals and writing the data in parallel in multiple bits in a different address again, a read/write test can be carried out without supplying write data from the data input/output terminals.

As shown in FIGS. 1, 8, and 9, according to the semiconductor memory device test method according to one exemplary embodiment of the present invention, the semiconductor memory device (100, 200) may further comprise, assuming that the above test mode is a first test mode, a second test mode in which, among the plurality of the data input/output terminals (DQ0 to DQ31), some of the terminals (DQ0, 8, 16, and 24), the number of which is smaller than the number of bits of the memory cell array, are used to write data in the multiple bits (32 bits) of the memory cell array 122 in parallel and the multiple-bit data read in parallel from the multiple bits (32 bits) is read with the terminals (DQ0, 8, 16, and 24). The second test mode may be used for writing first and second data in first and second region, respectively, in the memory cell array 122 in advance (steps S2 and S3 in FIG. 8) and reading data from the first region (step S9).

In accordance with the above method, for example, during wafer inspection, by probing some of a plurality of data input/output terminals, input/output circuits relating to the data input/output terminals that are not probed can also be tested.

The above exemplary embodiments of the present invention will be hereinafter described in detail based on examples with reference to drawings.

EXAMPLE 1

FIG. 1 shows an overall block diagram of a semiconductor memory device according to an example 1. While the semiconductor memory device according to the example 1 is a DDR-SDRAM, the present invention is not merely limited thereto. In FIG. 1, a semiconductor memory device (semiconductor memory chip) 100 comprises a memory core circuit unit 145 and an output circuit unit 113. Power is supplied to the memory core circuit unit 145 and the output circuit unit 113 via a VDD terminal and a VDDQ terminal, respectively. The semiconductor memory device 100 further comprises: data input/output terminals DQ0 to DQ31; a data mask signal input terminal DMn (n is 0 to 3, for example); a data strobe signal input/output terminal DQSn (n is 0 to 3, for example); a clock signal input terminal CLK; a command input terminal CMD; and an address input terminal ADD, among which, for example, the command input terminal CMD may be commonly used with another terminal. In addition, the semiconductor memory device further comprises a memory cell array 122, a row decoder 116, and a column decoder 117, as well as an input circuit 112, a data latch circuit 111, a data amplifier circuit 107, an output data buffer circuit 108, and the like that input and output data between the memory cell array 122 and the data input/output terminals DQ0 to DQ31. Also, the semiconductor memory device further comprises: a clock generation circuit 101 for generating an internal clock signal based on a CLK signal; an output clock generation circuit 104 for generating a clock relating to an operation for reading data from the memory cell array 122 and outputting the data to the outside; and an input data clock generation circuit 106 for generating a clock relating to an operation for capturing data from the outside and writing the data in the memory cell array.

Additionally, the semiconductor memory device further comprises: an input command latch/decode circuit 102 for latching and decoding an inputted command; and a control logic circuit 105 for outputting a signal controlling each part of the semiconductor memory device 100 based on command decode results and a clock signal. Also, the control logic circuit 105 outputs a test signal 1 (400), a test signal 2 (700), and a DQ/DQS input circuit enable signal 135, which control test modes that will be described in detail later.

Further, the semiconductor memory device comprises a test data latch circuit 138 and a data comparison/determination circuit 137 used in a second test mode in which 32-bit data is written in the memory cell array 122 by using 4 data input/output terminals (DQ0, DQ8, DQ16, and DQ24) among 32 data input/output terminals (DQ0 to DQ31) and 32-bit data is read from the memory cell array 122 with the above 4 data input/output terminals. Circuits relating to the test will be described in detail in the following description regarding the operation.

Next, the operation of the semiconductor memory device according to the example 1 will be described in the following order: a normal read/write operation; a read/write test mode operation using some of the data input/output terminals (second test mode); and a read/write test mode operation using normal input/output circuits (first test mode).

EXAMPLE 1

Normal Read/Write Operation

Figure 3:
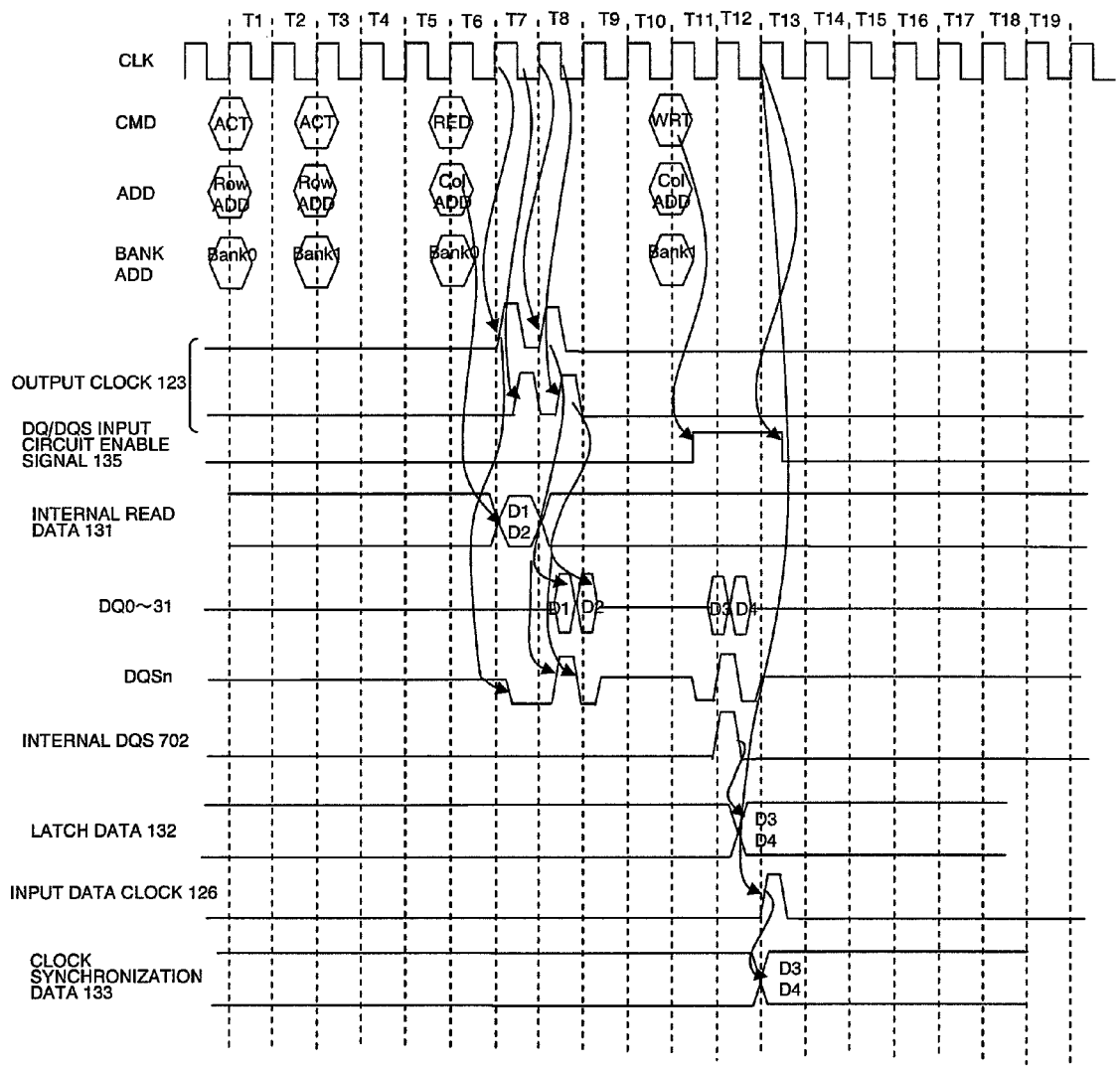
FIG. 3 shows a timing chart of a normal read/write operation of the semiconductor memory device according to one example of the present invention.

FIG. 3 shows a timing chart of a normal read/write operation when the burst length is 2 (BL2). As described above, since the semiconductor memory device of the example 1 is a DDR-SDRAM, the device executes a read/write operation according to the specifications thereof. Namely, first, prior to read/write commands, active commands (ACTs) for banks to be accessed are issued. In this case, since data is read from a Bank 0 and written in a Bank 1, an active command (ACT) is issued for each bank, and a row line selected by a row address is activated. Subsequently, when a read command (RED) for the Bank 0 is issued, memory cell data (D1 and D2) selected by a column address is sent from the memory cell array 122 in FIG. 1 to the data amplifier circuit 107, which amplifies the data and then sends the data as internal read data 131 to the output data buffer circuit 108. The internal read data (D1 and D2) 131 is alternately outputted to the data input/output terminals (DQ terminals) by the output clocks 123 generated by the leading and trailing edges of the clock at a cycle T8. Further, from the DQS terminal, a low-level signal is outputted by the output clock 123 in synchronization with the leading edge of the clock at a cycle T7, and high- and low-level signals are alternatively outputted by the output clocks 123 similarly generated by the leading and trailing edges of the clock at the cycle T8. Since the DQ and DQS terminals are controlled by the output clocks 123 and output data simultaneously in a read operation, the signals change at the same timing.

Next, when a write command (WRT) for the Bank 1 is issued, the input circuit 112 is enabled by the DQ/DQS input circuit enable signal 135 and captures external DQ/DQS signals. In synchronization with the clock signal at a cycle T12, a DQS signal and a DQ signal (D3 and D4) having the center of the effective period thereof aligned to the leading and trailing edge of the DQS signal are supplied from the outside. Further, the DQ signal is captured in the data latch circuit 111 by an internal DQS signal 702 generated by an internal DQS timing generation circuit 701 based on the DQS signal supplied from the outside.

Figure 2:
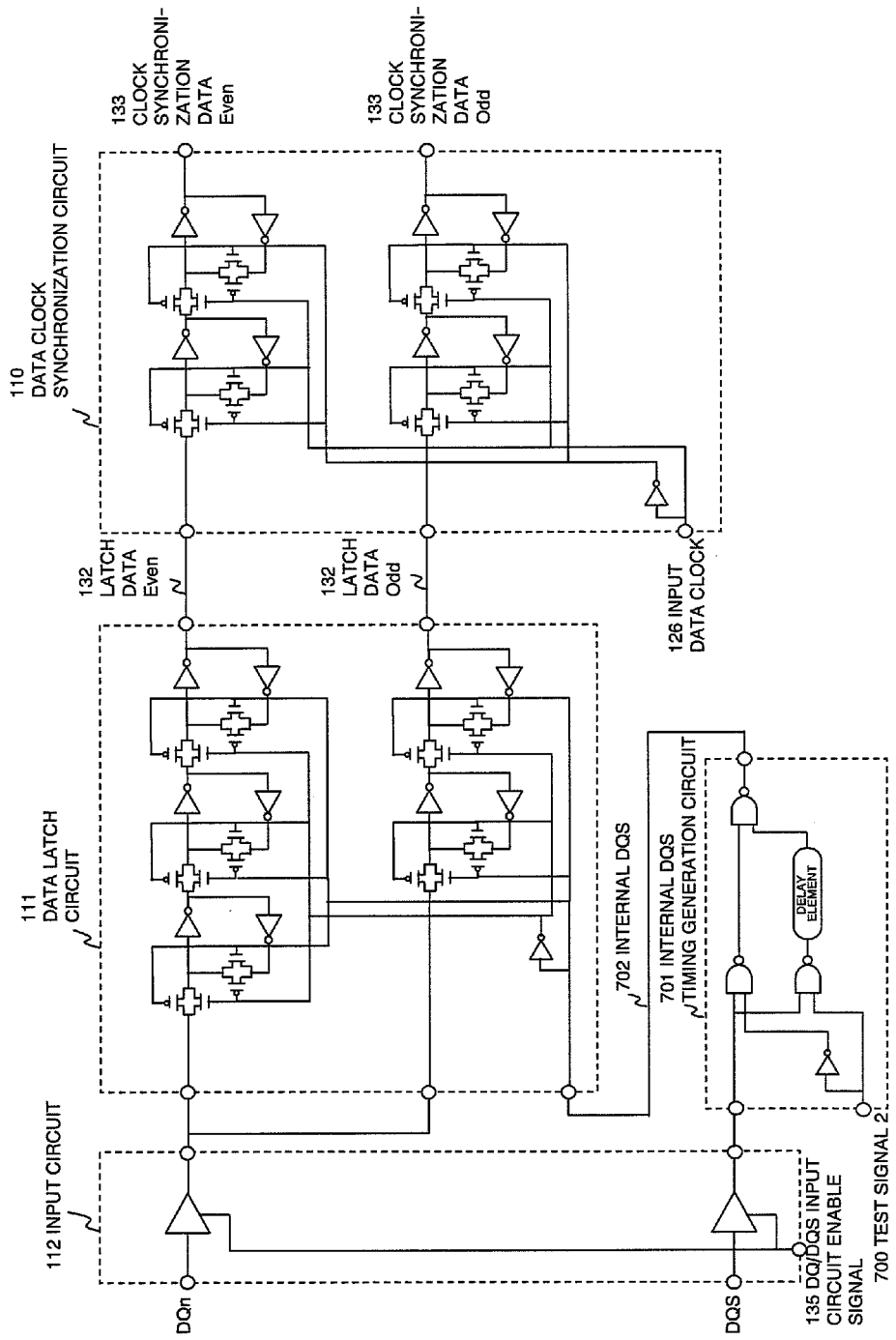
FIG. 2 shows a block diagram of a data input part of the semiconductor memory device according to one example of the present invention.

FIG. 2 shows configurations of the input circuit 112, the data latch circuit 111, the data clock synchronization circuit 110, and the internal DQS timing generation circuit 701. In a normal write operation, since the TEST signal 2 (700) is at a low level, the internal DQS signal 702 is approximately in phase with the DQS signal. The DQ signal (D3 and D4) captured in the data latch circuit 111 by the internal DQS signal 702 is inputted to the clock synchronization circuit 110 as latch data Even and Odd 132, and the signal is then latched by the input data clock 126 generated by the CLK signal at a cycle T13 in the data clock synchronization circuit 110. Subsequently, the timing of the signal is aligned to the CLK signal, and is then written as clock synchronization data Even and Odd 133 in the memory cell array 122 via a data switching circuit 136 and the write buffer circuit 109. As described above, in a write operation, the DQ signal is inputted prior to the DQS signal by ¼ CLK cycle so that the DQ signal can be latched by the DQS signal internally.

EXAMPLE 1

A Read/Write Test Mode Using Some of the Data Input/Output Terminals (Second Test Mode)

Figure 5:
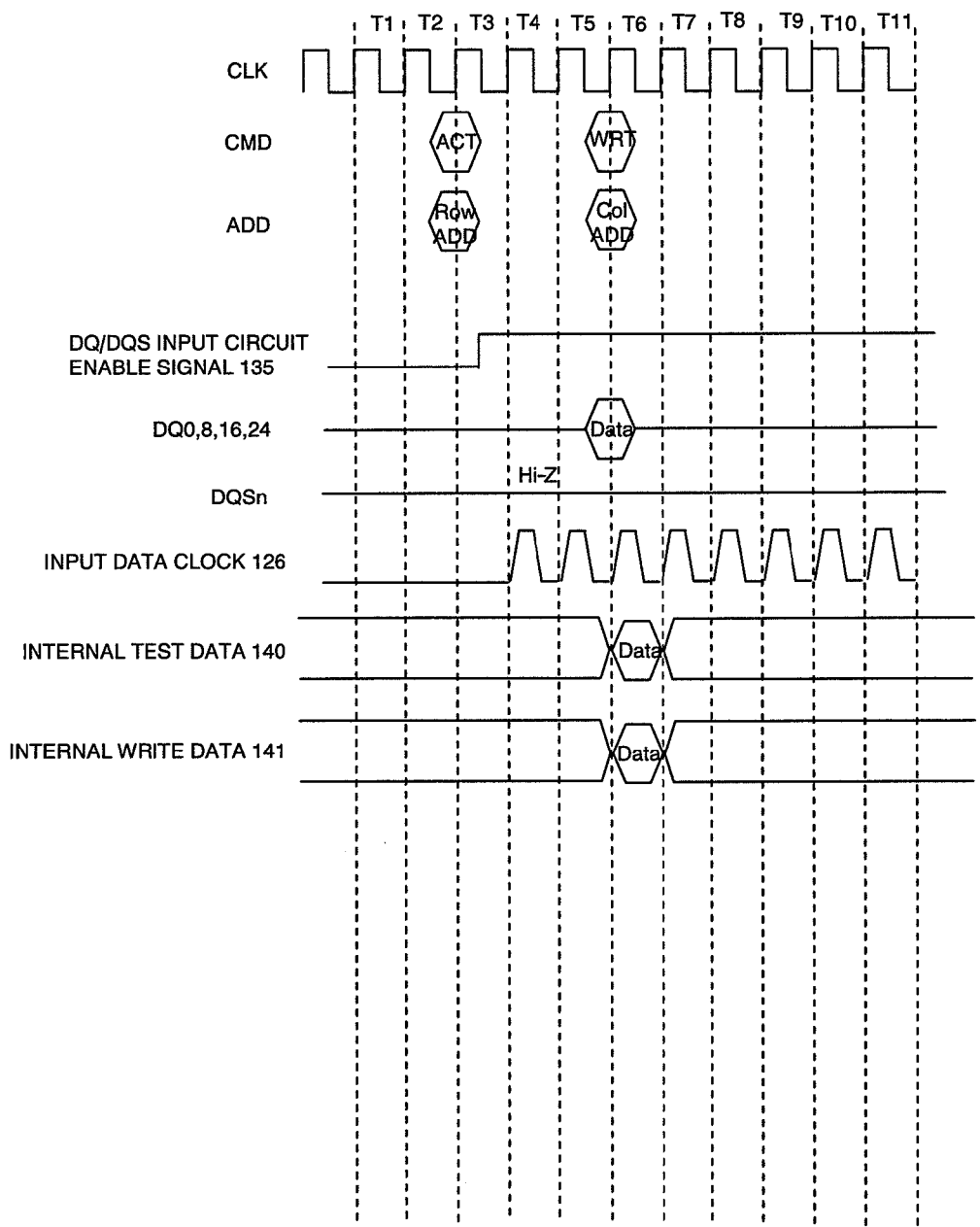
FIG. 5 shows a timing chart of a write test in the second test mode of the semiconductor memory device according to one example of the present invention.

Next, the operation of a second test mode in which a read/write test is executed on the memory cell array with some of the data input/output terminals DQ0 to DQ31 is described. FIG. 5 shows a timing chart of a write test in the second test mode of the example 1. In the second test mode, as described above, given DQ terminals alone are used to input write data. In the block diagram of the DRAM of FIG. 1, DQ0, DQ8, DQ16, and DQ24 terminals are used as test-mode DQ terminals. Also, in the second test mode, since the DQS terminal is not used either, the DQ signal having the center of the effective period aligned to the leading edge of the CLK signal is inputted, and is then latched by the input data clock 126 generated by the CLK signal in the test data latch circuit 138.

Figure 4:
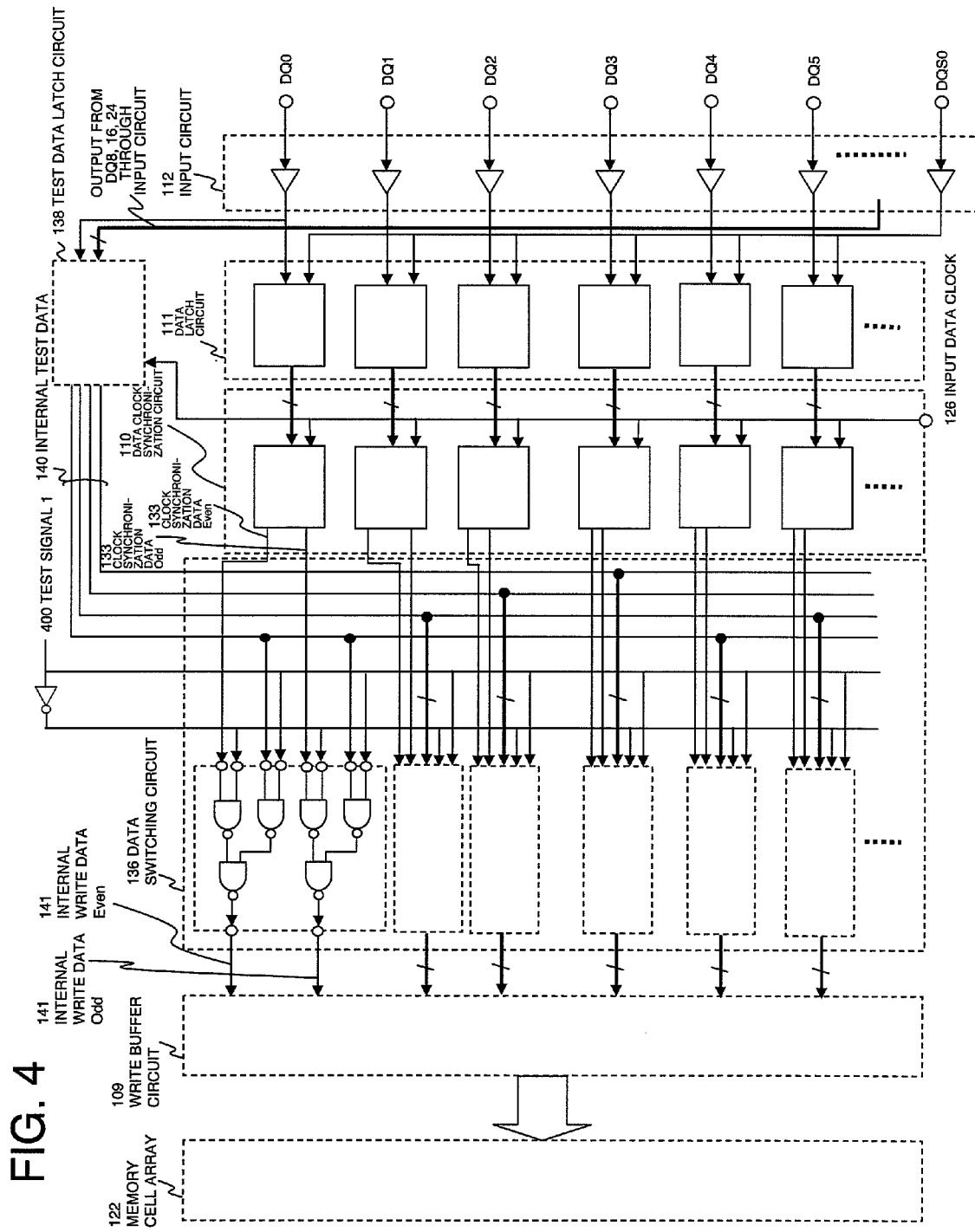
FIG. 4 shows a block diagram of a test data write circuit of the semiconductor memory device according to one example of the present invention (in a second test mode executed with some data input/output terminals).

FIG. 4 shows a block diagram of a portion relating to an operation for writing a data signal inputted from the DQ terminals DQ0, 8, 16, and 24 used in the second-test-mode in the memory cell array. As described above, the data signal inputted from the DQ terminals DQ0, 8, 16, and 24 is latched in the test data latch circuit 138 by the input data clock 126 generated by the CLK signal, and the signal is then inputted to the data switching circuit 136 as internal test data 140. In the second test mode, the TEST signal 1 (400) is at a high level, and the data is inputted through a path involving internal test data 140, unlike the data input path used in a normal operation involving individual DQ terminals. Further, 4 data DQ0, 8, 16, and 24 are sequentially assigned to the input corresponding to each DQ terminal, so that data patterns in consideration of physical arrangement of memory cells in the memory cell array can be written. Namely, the data switching circuit 136 is connected so that data inputted from any of the 4 terminals DQ0, 8, 16, and 24 is written in the 32 bits of the memory cell array that can be read/written simultaneously. The data outputted from the switching circuit 136 is inputted to the write buffer circuit 109 as internal write data 141 and written in the memory cell array 122.

Figure 6:
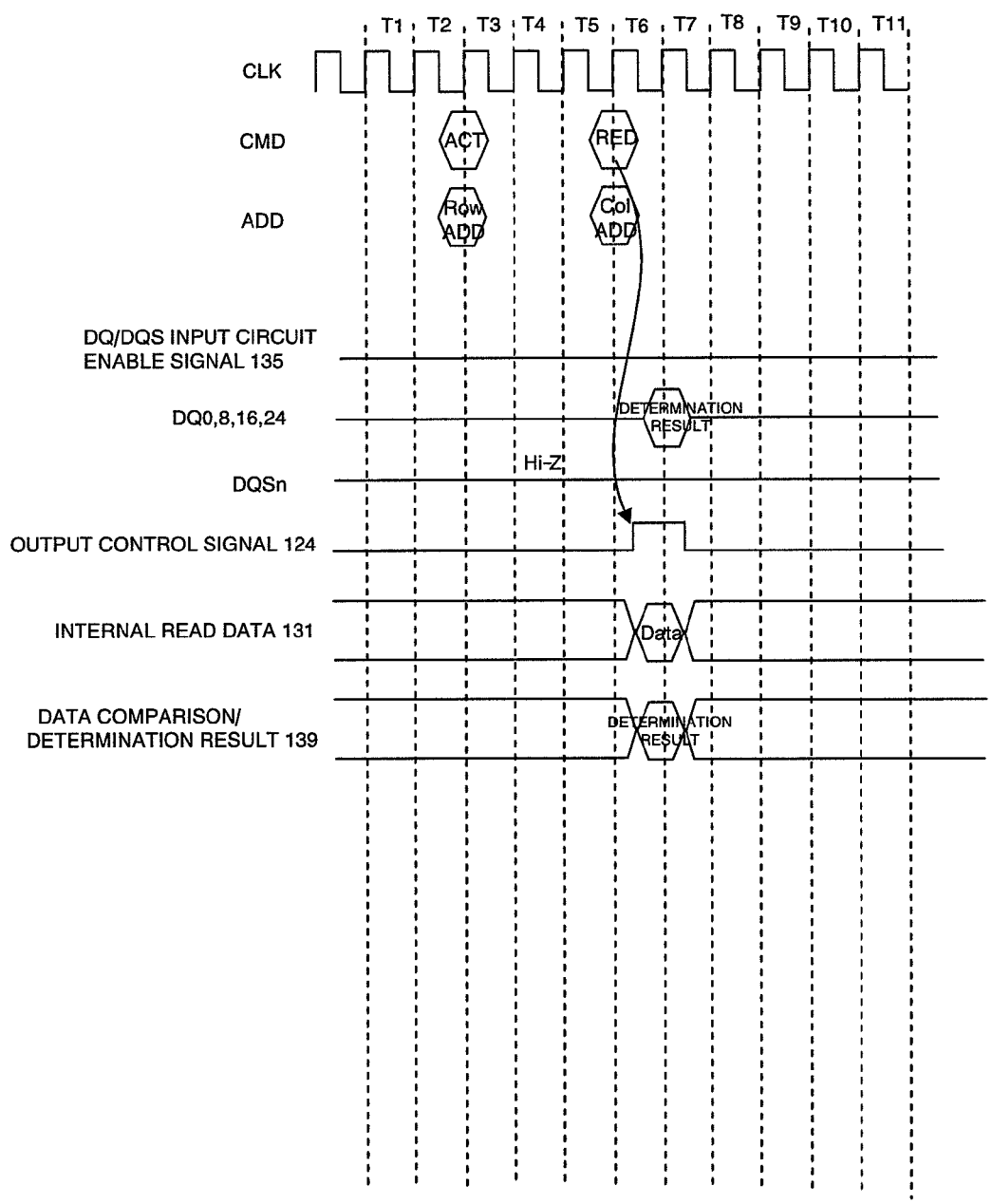
FIG. 6 shows a timing chart of a read test in the second test mode of the semiconductor memory device according to one example of the present invention.

FIG. 6 shows a timing chart of a read operation in the second test mode. In the second test mode, the data comparison/determination circuit 137 compares data simultaneously read to the 4 terminals DQ0, 8, 16, and 24 from the corresponding multiple bits in the memory cell array 122 to determine whether all the data matches, thereby making a decision to pass or fail. When a read command (RED) is issued after an active command (ACT), memory cell data selected by a column address is sent from the memory cell array 122 in FIG. 1 to the data amplifier circuit 107, which amplifies the data and then sends the data as internal read data 131 to the data comparison/determination circuit 137. Comparison is made for each DQ group in which the same internal test data 140 is written in the above write operation in the second test mode, and a data comparison/determination result 139 is sent to the output data buffer circuit 108. The data comparison/determination result 139 is outputted from the terminals DQ0, 8, 16, and 24 in the same cycle by the output control signal 124 outputted from the control logic circuit 105 in response to the read command.

As a result of the determination, a high-level signal is outputted when the data is determined to be "pass" and a low-level signal when the data is determined to be "fail." Namely, in a write operation in the second test mode, since the same data must have been written in the bits corresponding to the 4 bits DQ0, 8, 16, and 24 of the simultaneously-readable/writeable 32-bit data in the memory cell array, if each of the bit data corresponding the DQ0, 8, 16, and 24 of the 32-bit data simultaneously read from the memory cell array 122 is the same in the read operation, a high-level signal is outputted from the test DQ terminals (DQ0, 8, 16, and 24). If not, a low-level signal is outputted from the test DQ terminals (DQ0, 8, 16, and 24).

Thus, in accordance with the above second test mode, even in the case of a semiconductor memory device (DRAM chip) having many data input/output terminals (DQ terminals), the memory cell array thereof can be inspected by probing only a small number of the DQ terminals. However, with this second test mode alone, it is impossible to conduct the DRAM read/write test in a normal operation using all the above DQ terminals.

EXAMPLE 1

A Read/Write Test Mode Using Normal Input/Output Circuits (First Test Mode)

In the above test using the second test mode, input/output circuits relating to the data input/output terminals other than the test-mode DQ terminals 0, 8, 16, and 24, such as the input circuit 112, the data latch circuit 111, the data clock synchronization circuit 110, the output data buffer circuit 108, the output circuit unit 113, and wirings connecting these circuits, are not tested. In accordance with a first test mode described below, input/output circuits relating to the data input/output terminals that are not probed can also be tested during wafer inspection.

FIG. 7 shows a timing chart of a read/write test mode using normal input/output circuits (first test mode). In FIG. 7, first, prior to read/write commands, active commands (ACTs) for banks to be accessed are issued. In this case, since data is read from a Bank 0 and written in a Bank 1, an active command (ACT) is issued for each bank, and a row line selected by a row address is activated. Subsequently, when a read command (RED) for the Bank 0 is issued, memory cell data (D1 and D2) selected by a column address is sent from the memory cell array 122 in FIG. 1 to the data amplifier circuit 107, which amplifies the data and then sends the data as internal read data 131 to the output data buffer circuit 108. The internal read data (D1 and D2) 131 is alternately outputted to the DQ terminals by the output clocks 123 generated by the leading and trailing edges of the clock at the cycle T8. Further, from the DQS terminal, a low-level signal is outputted by the output clock 123 in synchronization with the leading edge of the clock at the cycle T7, and high- and low-level signals are alternately outputted by the output clocks 123 similarly generated by the leading and trailing edges of the clock at the cycle T8.

In this first test mode, the DQ/DQS input circuit enable signal 135 is turned on by the read command, and the input circuit 112 is enabled to capture DQ/DQS signals. In a read operation, since DQ and DQS signals are simultaneously outputted by the output clocks 123, they are at the same timing. Since the TEST signal 2 (700) is at a high level and the internal DQS signal 702 is generated via a delay element, the latch timing of the internal DQS signal 702 is secured with respect to the DQ signal in the data latch circuit 111. Thus, the internal DQS signal 702 can properly capture the DQ signal (D1 and D2). Next, when a write command (WRT) for the Bank 1 is issued, the DQ signal (D1 and D2) captured in the data latch circuit 111 is latched in the data clock synchronization circuit 110 as latch data Even and Odd 132 by the input data clock 126 generated by the CLK signal at a cycle T10. The timing of the latch data Even and Odd 132 is aligned to the CLK signal, and the data is then written in the memory cell array 122 as clock synchronization data Even and Odd 133 via the data switching circuit 136 and the write buffer circuit 109.

Namely, in a normal read/write operation, when a write command is executed, the DQ/DQS input circuit enable signal 135 is turned on, the input circuit 112 is enabled, and data supplied from the data input/output terminals is captured. When a read command is executed, the DQ/DQS input circuit enable signal 135 remains turned off and the input circuit 112 remains disenabled. In addition, when a write command is executed, the data latch circuit 111 latches data outputted from the input circuit 112. The data latch circuit 111 does not latch the data when a read command is executed.

In contrast, in the first test mode, when a read command is executed, the DQ/DQS input circuit enable signal 135 is turned on and the input circuit 112 is enabled to capture data from the data input/output terminals. When a write command is executed, the input circuit 112 remains turned off and it does not capture data supplied from the data input/output terminals. Also, the data latch circuit 111 latches data outputted from the input circuit 112 when a read command is executed. The data latch circuit 111 does not latch the data when a write command is executed.

As shown in FIG. 7, a write command (WRT) is captured by the leading edge of the clock at the cycle T8, and thereafter, data is latched in the data latch circuit 111 by the edges of the internal DQS signal 702 attributable to execution of the read command (RED). However, this is due to pipeline processing in which a command is processed with a delay from capture to execution. As described above, in the first test mode, execution of a write command does not enable the input circuit 112 or cause the data latch circuit 111 to latch data from the data input/output terminals.

Also, when a normal write command is executed, a data strobe signal is supplied from the data strobe terminal (DQS terminal) in accordance with the timing of data supplied from the data input/output terminals (DQ terminals) on the memory controller side. Thus, it is only necessary to allow the data latch circuit 111 to latch data in synchronization with the data strobe signal (DQS signal) supplied from the outside. However, in the first test mode, the timing at which data read from the memory cell array 122 to the data input/output terminals (DQ0 to DQ31) is latched in the data latch circuit 111 is not given from the outside. Thus, by causing the internal DQS timing generation circuit 701 in FIG. 2 to generate an internal DQS signal lagging behind the DQ signal by ¼ cycle, data read from the memory cell array 122 is latched in the data latch circuit 111.

As described above, by using the first test mode, data read from memory cells can be outputted from DQ terminals, the output data can be inputted to the input circuit, and the data can be written in the memory cells again, without supplying signals to the DQ and DQS terminals from the outside.

EXAMPLE 2

Next, a semiconductor memory device test method of an example 2 will be described. The example 2 is a method for testing the semiconductor memory device 100 by using the first and second test modes described in the example 1. FIG. 8 is a flow chart of the test method of the example 2. Based on the flow chart in FIG. 8, the operation of the input/output circuits can be checked without probing all the DQ terminals during wafer inspection. First, the semiconductor memory device 100 is set in the second test mode, which is used to conduct a read/write test using some of the data input/output terminals (step S1). The device may be set in the second test mode by applying a voltage that is not used in a normal operation to a certain terminal or by executing a certain command. Alternatively, a known method may be used to set the device in the test mode. Next, a data pattern 0101 is written in the memory cells of an address X=#000 to #0FF (step S2), and an inverse data pattern 1010 is written in the memory cells of an address X=#100 to #1FF (step S3).

Next, the second test mode is cancelled (step S4), and the device is set in the first test mode (step S5). The data pattern 1010 written in X=#100 to #1FF is read from the memory cells to the terminals DQ0 to DQ31, and the data pattern is written in the memory cells of the address X=#000 to #0FF by a write command inputted subsequently (step S6). Next, the second test mode is set again (steps S7 and S8). The rewritten memory cell data of the address X=#000 to #0FF is read and compared, so as to determine whether the input/output circuits have operated properly (step S9).

The same procedure is carried out for the address X=#100 to #1FF. Namely, after the step S9, in the second test mode, the data pattern 1010 is written in the address X=#000 to #0FF and the inverse data pattern 0101 in the address X=#100 to #1FF (steps S10 and S11). Next, the mode is switched to the first test mode (steps S12 and S13), the data in the address X=#000 to #0FF is read and written in the memory cells of the address X=#100 to #1FF (step S14). The mode is switched to the second test mode again (steps S15 and S16), and the rewritten memory cell data of the address X=#100 to #1FF is read and compared (step S17). In accordance with this procedure, a test using input/output circuits in a normal operation is conducted on all cells of a DRAM.

In accordance with the above procedure, in the wafer inspection process, by only probing some of the data input/output terminals used in the second test mode, input/output circuits relating to the other data input/output terminals that are not probed can also be tested. Also, in the above example 2, while the first test mode is used in combination with the second test mode, an effective test can be carried out without combining the first test mode with the second test mode. For example, it is possible to conduct a self-diagnostic test after the semiconductor memory device is incorporated in a system, by initializing the memory cell array with a normal write command, repeating read and write operations in the first test mode, transferring data sequentially, and reading the final results with a normal read command.

Further, in the example 2, a step for switching the test mode is provided between reading/writing in the first test mode and reading/writing in the second test mode. However, reading/writing may be automatically switched between the normal mode, the first test mode, and the second test mode, after receiving a command of a different mode.

EXAMPLE 3

The above example 1 is an effective example in cases in which only 2-bit data is inputted/outputted through read/write commands. While normal data output includes a burst mode for sequentially inputting/outputting 4, 8, or 16-bit data, if more than 2-bit data is sequentially outputted in the example 1, the latch data Even and Odd 132 outputted from the data latch circuit 111 is caused to be updated, which makes it impossible to rewrite the data read to the data input/output terminals, and therefore a test cannot be conducted properly. In the example 3, in order to enable a test in a burst operation for outputting more than 2-bit data, a FIFO circuit for receiving and storing data in a read operation is provided. The FIFO circuit sequentially stores the DQ data in response to the input of the data strobe signal DQS in a read operation, and the circuit sequentially sends the data therein to the data CLK synchronization circuit in response to the input data clock in a write operation.

Figure 10:
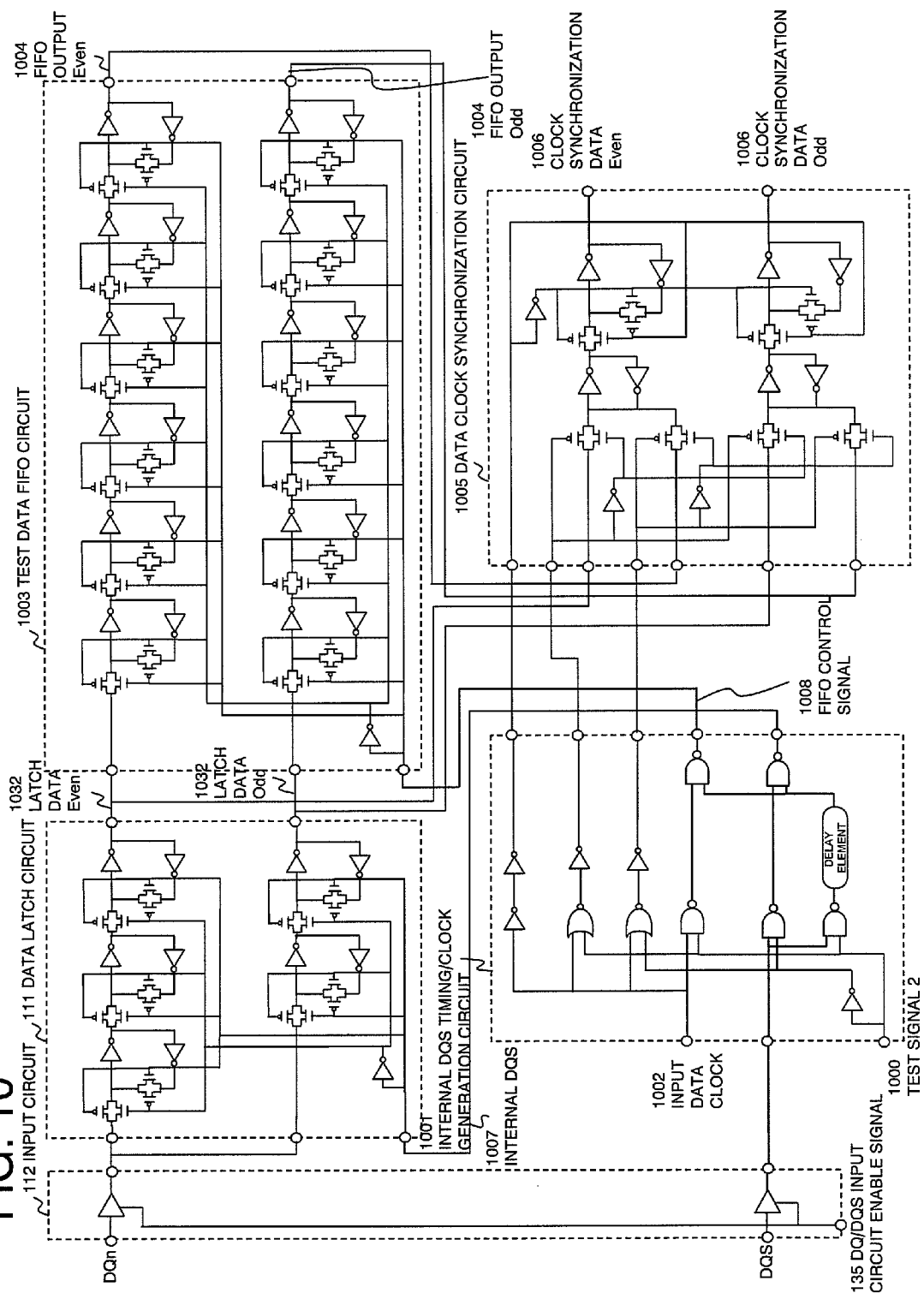
FIG. 10 shows a block diagram of a data input part of the semiconductor memory device according to another example of the present invention.

FIG. 9 shows a block diagram of an overall semiconductor memory device of the example 3, and FIG. 10 shows a block diagram of a data input part of the device. When FIG. 9 is compared with FIG. 1, which shows a block diagram of an overall semiconductor memory device of the example 1, it is seen that the example 3 is different from the example 1 in that an internal DQS timing/clock generation circuit 1001 is used instead of the internal DQS timing generation circuit 701 and that a test data FIFO circuit 1003 is provided between the data latch circuit 111 and the data clock synchronization circuit 110. The example 3 is generally the same as the example 1 in other aspects. Portions that are almost the same as those in example 1 are denoted by the same reference characters and the descriptions thereof are omitted.

Figure 11:
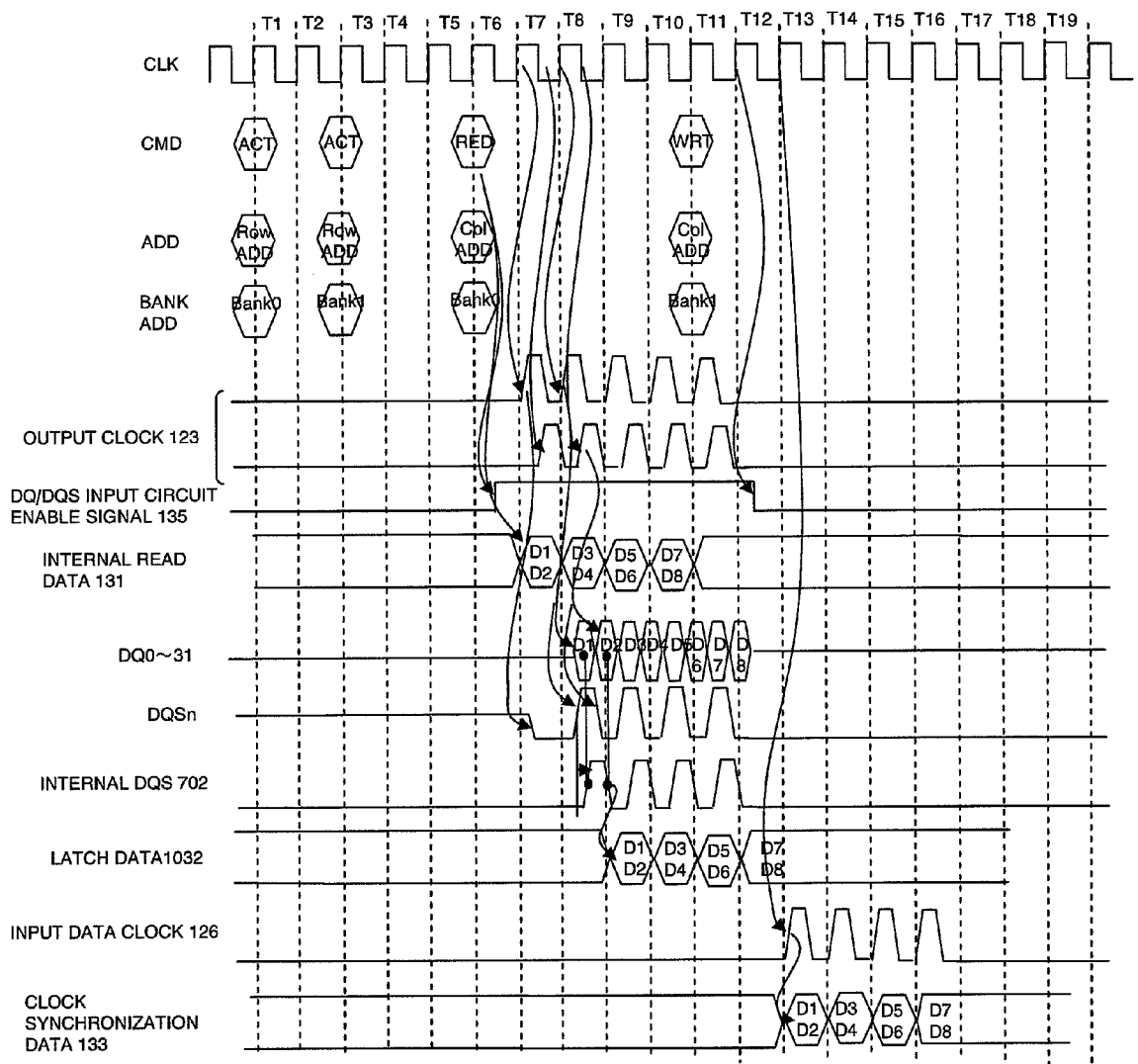
FIG. 11 shows a timing chart of a burst read/write test of the semiconductor memory device according to another example of the present invention.

FIG. 11 shows a timing chart of a burst read/write test conducted on a semiconductor memory device 200 of the example 3. In the timing chart of FIG. 11, first, prior to read/write commands, active commands (ACTs) for banks to be accessed are issued. Subsequently, when a read command (RED) for the Bank 0 is issued, memory cell data (D1 and D2) selected by a column address is sent from the memory cell array 122 in FIG. 9 to the data amplifier circuit 107, which amplifies the data and then sends the data as internal read data 131 to the output data buffer circuit 108. The internal read data (D1 and D2) 131 is alternately outputted to the DQ terminals by the output clocks 123 generated by the leading and trailing edges of the clock at the cycle T8. Further, high- and low-level DQS signals are alternately outputted from the DQS terminals by the output clocks 123. The DQ/DQS input circuit enable signal 135 is turned on by the read command, and the input circuit 112 is enabled to capture DQ/DQS signals.

As in the example 1, since the TEST signal 2 (1000) is caused to be at a high level and an internal DQS signal 1007 is generated via a delay element, the latch timing of the internal DQS signal 1007 is secured with respect to the DQ signal in the data latch circuit 111, and the DQ signal (D1 and D2) can be captured properly. Next, after the cycle T7 at which the read command is inputted, memory cell data (D3 to D8) of an internally-generated address is read by 2 bits at a cycle from an inputted column address to the DQ terminals. The data thus outputted is received by the input circuit 112 and is then sequentially captured in the data latch circuit 111. Latch data Even and Odd 1032 outputted from the data latch circuit 111 is sequentially stored in the test data FIFO circuit 1003 by a FIFO control signal 1008 generated by the DQS signal. When the 8-bit data is outputted at a cycle T12, an FIFO output 1004 represents initial data (D1 and D2).

Next, when a write command (WRT) for the Bank 1 is issued, the FIFO control signal 1008 is generated by an input data clock 1002, not by the DQS signal. The data in the FIFO circuit is then sequentially latched in a data clock synchronization circuit 1005 at each cycle, starting with the initial data (D1 and D2). The data having the timing thereof aligned to the CLK signal is sequentially written in the memory cell array 122 at each cycle as the clock synchronization data Even and Odd 133 via the data switching circuit 136 and the write buffer circuit 109.

Thus, in accordance with the burst read/write test mode of the example 3, without supplying signals to the DQ and DQS terminals from the outside, the burst data sequentially read from memory cells is outputted from the DQ terminals, the input circuit receives the outputted data, and the data is written in the memory cells again. Also, with the semiconductor memory device of the example 3, by replacing the read/write operation in the first mode in the example 2 with the burst read/write operation, input/output circuits relating to the data input/output terminals that are not probed can also be tested in the burst read/write operation.

The circuit configuration of the test data FIFO circuit 1003 is arbitrary as long as it is a buffer circuit having a function of storing the latch data 1032 in synchronization with the FIFO control signal 1008 and outputting data to the FIFO output 1004 in synchronization with the FIFO control signal 1008, with the initially inputted data first. For example, a FIFO circuit using a dual-port SRAM may be used.

Also, in the examples 1 and 3, test-related control signals, such as the TEST signal 1 (400), the TEST signal 2 (700, 1000), and the DQ/DQS input circuit enable signal 135, are outputted from the control logic circuit 105. However, a dedicated control circuit for test purposes may be provided to output control signals relating to the above tests. Further alternatively, other circuits may output control signals relating to the tests.

In the present invention, the following modes are possible.
(Mode 1):
As mentioned as the first aspect.
(Mode 2):
The semiconductor memory device may further comprise an input circuit configured to send data from the data input/output terminal to the data latch circuit, the input circuit turning on in a normal write operation and turning off in a normal read operation, wherein, in the test mode, the input circuit turns on in a read operation and turns off in a write operation.
(Mode 3):
The semiconductor memory device may further comprise an internal data strobe signal generation circuit, wherein, in a normal write operation, data captured from the data input/output terminal is latched in the data latch circuit in synchronization with a data strobe signal supplied from the outside, and, in a read operation in the test mode, data read to the data input/output terminal is latched in synchronization with an internal data strobe signal generated by the internal data strobe signal generation circuit.
(Mode 4):
The semiconductor memory may further comprise, in the test mode, a FIFO circuit that temporarily captures data read by a burst operation from the memory cell array to the input/output terminal; and a clock generation circuit that generates a clock capturing data into the FIFO circuit and a clock sending the data captured into the FIFO circuit toward the memory cell array.
(Mode 5):
As mentioned as the second aspect.
(Mode 6):
The synchronous semiconductor memory device may further comprise an input circuit configured to send data from the data input/output terminal to the data latch circuit, the input circuit turning on when a normal write command is executed and turning off when a normal read command is executed, wherein, in the test mode, the input circuit turns on when a read command is executed and turns off when a write command is executed.
(Mode 7):
The synchronous semiconductor memory device may comprise, in the test mode, a buffer circuit that temporarily captures data read by a burst operation from the memory cell array to the input/output terminal; and a clock generation circuit that generates a clock capturing data into the buffer circuit and a clock sending data captured into the buffer circuit toward the memory cell array in the order of capture.
(Mode 8):
As mentioned as the third aspect.
(Mode 9):
The semiconductor memory device may further comprise, a FIFO circuit; a fourth command for sequentially storing data read by a burst operation from the memory cell array to the input/output terminal in the FIFO circuit; and a fifth command for writing data stored in the FIFO circuit in the memory cell array by a burst operation, without newly capturing data from the data input/output terminal.
(Mode 10):
As mentioned as the forth aspect.
(Mode 11):
The semiconductor memory device may further comprise, assuming that the above test mode is a first test mode, a second test mode in which part of the plurality of data input/output terminals, the number of which is smaller than the number of bits of the memory cell array, is used to write data in the multiple bits of the memory cell array in parallel and read the multiple-bit data from the multiple bits in parallel. Writing first and second data in first and second region, respectively, in the memory cell array in advance and reading data from the first region are implemented with the second test mode.
(Mode 12):
After the test in which data is read from the first region, the second data is written in the first region with the second test mode, the first data is written in the second region with the second test mode, the first data read from the first region is written in the second region with the first test mode, and a read test is conducted on the second region with the second test mode.
(Mode 13):
The semiconductor memory device may comprise, in the first test mode, a function of writing by a burst operation data read by a burst operation from the memory cell array in a region having an initial address different from the address read by the burst operation. Writing the second data read from the second region in the first region with the first test mode and writing the first data read from the first region in the second region with the first test mode are implemented with the function of burst reading and burst writing.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor device comprising:
   a data input/output terminal configured to supply write data in a normal write operation and to supply read data in a test mode; and
   an internal circuit configured to store the write data supplied by the data input/output terminal and to output the stored write data as the read data supplied the data input/output terminal; and
   a data latch circuit that captures and temporarily latches the write data supplied from the data input/output terminal in the normal write operation, latches the read data that is read from the internal circuit in response to a read operation in the test mode, and outputs the latched read data to the internal circuit in response to a write operation in the test mode.

2. The semiconductor device according to claim 1, the internal circuit includes a memory cell array.

3. The semiconductor device according to claim 2, further comprising an input circuit that sends write data from the data input/output terminal to the data latch circuit, the input circuit turning on in the normal write operation and turning off in a normal read operation, wherein, in the test mode, the input circuit turns on in response to the read operation.

4. The semiconductor device according to claim 3, wherein, in the test mode, the input circuit turns off in response to a write operation.

5. The semiconductor device according to claim 2, further comprising an internal data strobe signal generation circuit, wherein, in the normal write operation, the write data supplied from the data input/output terminal is latched in the data latch circuit in synchronization with a data strobe signal supplied from the outside, and, in the read operation in the test mode, the read data is read to the data input/output terminal and is latched in synchronization with an internal data strobe signal generated by the internal data strobe signal generation circuit.

6. The semiconductor device according to claim 2, further comprising, in the test mode, a FIFO circuit that temporarily captures data read by a burst operation from the internal circuit to the data input/output terminal; and a clock generation circuit that generates a clock capturing data into the FIFO circuit and a clock sending the data captured into the FIFO circuit toward the internal circuit.

7. The semiconductor device according to claim 2, wherein the data latch circuit temporarily latches the write data supplied from the data input/output terminal in synchronization with a data strobe signal supplied from the outside in the normal write operation.

8. The semiconductor device according to claim 7, further comprising an internal data strobe signal generation circuit generates an internal data strobe signal so that the data latch circuit latches the read data that is read to the data input/output terminal in synchronization with the internal data strobe signal in response to the read operation in the test mode and writes the latched read data in the internal circuit in response to the write operation in the test mode.

9. The semiconductor device according to claim 2, further comprising a command decoder that receives a command to generate the read operation and the write operation.

10. The semiconductor device according to claim 1, further comprising an internal data strobe signal generation circuit, wherein, in the normal write operation, the write data supplied from the data input/output terminal is latched in the data latch circuit in synchronization with a data strobe signal supplied from the outside, and, in the read operation in the test mode, the read data is read to the data input/output terminal and is latched in synchronization with an internal data strobe signal generated by the internal data strobe signal generation circuit.

11. The semiconductor device according to claim 1, further comprising, in the test mode, a FIFO circuit that temporarily captures data read by a burst operation from the internal circuit to the data input/output terminal; and a clock generation circuit that generates a clock capturing data into the FIFO circuit and a clock sending the data captured into the FIFO circuit toward the internal circuit.

12. The semiconductor device according to claim 1, wherein the data latch circuit temporarily latches the write data supplied from the data input/output terminal in synchronization with a data strobe signal supplied from the outside in the normal write operation.

13. The semiconductor device according to claim 12, further comprising an internal data strobe signal generation circuit generates an internal data strobe signal so that the data latch circuit latches the read data that is read to the data input/output terminal in synchronization with the internal data strobe signal in response to the read operation in the test mode and writes the latched read data in the internal circuit in response to the write operation in the test mode.

14. A semiconductor device comprising:
   a data input/output terminal;
   an internal circuit;
   a data latch circuit that temporarily latches data captured from the data input/output terminal in a normal write operation, latches data read from the internal circuit in response to a read operation in a test mode, and outputs the latched data which is read from the internal circuit to the internal circuit in response to a write operation in the test mode; and
   an input circuit that sends data from the data input/output terminal to the data latch circuit, the input circuit turning on in the normal write operation and turning off in a normal read operation, wherein, in the test mode, the input circuit turns on in response to the read operation.

15. The semiconductor device according to claim 14, wherein, in the test mode, the input circuit turns off in response to a write operation.

16. A semiconductor device comprising:
   a data input/output terminal configured to supply write data in a normal write operation, to supply read data in a normal read operation, and to supply the read data in a test mode; and
   an internal circuit configured to store the write data and output the write data as read data;
   a data latch circuit that latches the write data supplied from the data input/output terminal in the normal write operation without latching the read data that is read from the internal circuit in the normal read operation,
   wherein the data latch circuit latches the read data which is read from the internal circuit in response to a read operation in the test mode and outputs the latched read data to the internal circuit in response to a write operation in the test mode.

17. The semiconductor device according to claim 16, further comprising:
an output circuit coupled between the data input/output terminal and the internal circuit and outputting the read data that is read from the internal circuit in the normal read operation and in the read operation in the test mode to the data input/output terminal; and
an input circuit coupled between the data input/output terminal and the data latch circuit, the input circuit being activated in the normal write operation and in the read operation in the test mode so as to output data supplied to the data input/output terminal to the data latch circuit in the normal write operation and in the read operation in the test mode.

18. The semiconductor device according to claim 16, further comprising a write buffer coupled between the internal circuit and the data latch circuit and writing the data output from the data latch circuit to the internal circuit.

* * * * *